United States Patent
Cai et al.

(10) Patent No.: US 9,335,597 B2
(45) Date of Patent: May 10, 2016

(54) ARRAY SUBSTRATE AND MANUFACTURING METHOD THEREOF, LIQUID CRYSTAL DISPLAY PANEL, AND DISPLAY DEVICE (71) Applicants: BOE TECHNOLOGY GROUP CO., LTD., Beijing (CN); BEIJING BOE DISPLAY TECHNOLOGY CO., LTD., Beijing (CN)

(72) Inventors: Zhenfei Cai, Beijing (CN); Xiaopeng Cui, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/397,979

(22) PCT Filed: Dec. 13, 2013

(86) PCT No.: PCT/CN2013/089320
§ 371 (c)(1),
(2) Date: Oct. 30, 2014

(87) PCT Pub. No.: WO2015/027616
PCT Pub. Date: Mar. 5, 2015

(65) Prior Publication Data
US 2015/0309381 A1    Oct. 29, 2015

(30) Foreign Application Priority Data

Aug. 30, 2013  (CN) .......................... 2013 1 0388570

(51) Int. Cl.
*G02F 1/1362* (2006.01)
*H01L 27/12* (2006.01)
*G02F 1/1345* (2006.01)

(52) U.S. Cl.
CPC ........ *G02F 1/136286* (2013.01); *G02F 1/1345* (2013.01); *H01L 27/124* (2013.01); *H01L 27/1248* (2013.01); *H01L 27/1259* (2013.01); *G02F 2201/50* (2013.01)

(58) Field of Classification Search
None
See application file for complete search history.

(56) References Cited

U.S. PATENT DOCUMENTS

| 6,373,546 B1 | 4/2002 | Kim |
| 2002/0101548 A1* | 8/2002 | Kim ..................... G02F 1/13458 349/43 |

(Continued)

FOREIGN PATENT DOCUMENTS

| CN | 101398589 A | 4/2009 | |
| JP | 10170933 A * | 6/1998 | ............ G02F 1/1343 |

(Continued)

OTHER PUBLICATIONS

Search Report issued in International Application No. PCT/CN2013/089320, twelve (12) pages.

(Continued)

*Primary Examiner* — Ha Tran T Nguyen
*Assistant Examiner* — Jordan Klein
(74) *Attorney, Agent, or Firm* — Nath, Goldberg & Meyer; Joshua B. Goldberg (57) ABSTRACT

The invention provides an array substrate and a manufacturing method thereof, a liquid crystal display panel and a display device. The array substrate includes a display region and a non-display region, wherein a plurality of data signal lines are provided in the display region, and a plurality of connection terminal pads and a plurality of metal wires connecting the connection terminal pads with the respective data signal lines are provided in the non-display region, wherein at least one blocking part covering the plurality of metal wires is provided above the plurality of metal wires. In the array substrate of the invention, as the at least one blocking part covering the metal wires is provided above the metal wires, which can block foreign objects from contacting the metal wires, thus the cutting debris can be prevented from scratching the metal wires in the cutting process.

16 Claims, 4 Drawing Sheets

(56) References Cited

U.S. PATENT DOCUMENTS

| | | | |
|---|---|---|---|
| 2005/0041192 A1* | 2/2005 | Kuo | G02F 1/1345 349/152 |
| 2008/0128699 A1* | 6/2008 | Seong | G02F 1/1345 257/59 |
| 2012/0228624 A1* | 9/2012 | Sakai | H01L 27/3276 257/72 |
| 2014/0375910 A1* | 12/2014 | Tada | G06F 3/044 349/12 |

FOREIGN PATENT DOCUMENTS

| | | | | |
|---|---|---|---|---|
| JP | H10170933 A | | 6/1998 | |
| JP | 2004226858 A | | 8/2004 | |
| JP | 2007078931 A | * | 3/2007 | ............ G02F 1/1333 |
| JP | 2010281905 A | | 12/2010 | |
| JP | 2013050472 A | | 3/2013 | |

OTHER PUBLICATIONS

Chinese Office Action dated Jun. 3, 2015 issued in corresponding Chinese Application No. 201310388570.8.

Written Opinion of the International Searching Authority dated Jun. 5, 2014 issued in International Application No. PCT/CN2013/089320.

\* cited by examiner

FIG. 1a

Prior Art

FIG. 1b

Prior Art

ARRAY SUBSTRATE AND MANUFACTURING METHOD THEREOF, LIQUID CRYSTAL DISPLAY PANEL, AND DISPLAY DEVICE

This is a National Phase Application filed under 35 U.S.C. 371 as a national stag of PCT/CN2013/089320, filed Dec. 13, 2013, and claims priority benefit from Chinese Application No. 201310388570.8, filed Aug. 30, 2013, the content of each of which is hereby incorporated by reference in its entirety.

TECHNICAL FIELD

The present invention relates to the field of display technology, particularly to an array substrate and a manufacturing method thereof, a liquid crystal display panel and a display device.

BACKGROUND ART

Figure 1A:
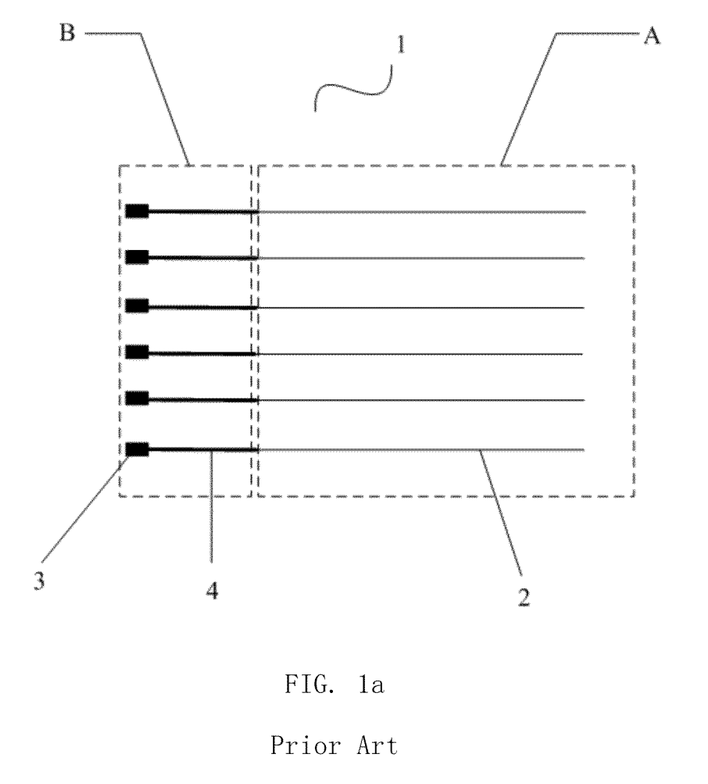
FIG. 1a is a diagram illustrating arrangements of data signal lines and metal wires of the array substrate in the prior art.

A liquid crystal display panel is composed of an array substrate, an opposite substrate and liquid crystal molecules provided between the array substrate and the opposite substrate. As shown in FIG. 1a, a plurality of data signal lines 2 and a plurality of gate signal lines (not shown in FIG. 1a) are provided in a display region A in the array substrate 1, and a plurality of connection terminal pads 3 and a plurality of metal wires 4 connecting the connection terminal pads 3 with the data signal lines 2 are provided in a non-display region B in the array substrate 1 respectively.

Figure 1B:
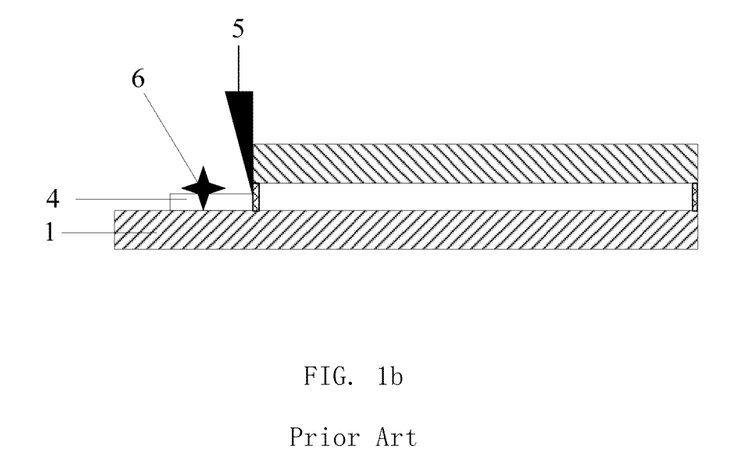
FIG. 1b is a diagram illustrating how to cut the liquid crystal display panel in the prior art.

In manufacturing a liquid crystal display panel, the array substrate and the opposite substrate are aligned and assembled, and then are cut. In cutting, as shown in FIG. 1b, as the metal wires 4 have a certain thickness and project from the array substrate 1, when the cutter head 5 is cutting, cutting debris 6 inevitably falls on the metal wires 4 of the array substrate 1, so that the metal wire 4 is very easy to be scratched to be broken, and thus the metal wire 4 cannot transmit electrical signal. Generally, the cutting process is performed in the last phase of manufacture of the liquid crystal display panel, and if the metal wire 4 is broken, the whole liquid crystal display panel will be scrapped, thus the cost for manufacturing the liquid crystal display panel will be increased extremely. Also, although the metal wire 4 in the prior art is coated with insulation material, the hardness of the insulation material is low, therefore, the probability of the metal wire to be scratched by the cutting debris is very high.

SUMMARY

Embodiments of the invention provide an array substrate and a manufacturing method thereof, a liquid crystal display panel and a display device, to solve the problem that the metal wire is scratched by cutting debris in the cutting process.

Based on the above, the invention provides an array substrate comprising a display region and a non-display region, wherein a plurality of data signal lines are provided in the display region, and a plurality of connection terminal pads and a plurality of metal wires connecting the connection terminal pads with respective the data signal lines are provided in the non-display region, wherein at least one blocking part covering the plurality of metal wires is provided above the plurality of metal wires.

In the array substrate of the invention, as the at least one blocking part covering the metal wires is provided above the metal wires, and can block foreign objects from contacting the metal wires, comparing to the array substrate in the prior art, it is possible to prevent the cutting debris from scratching the metal wires in the cutting process, and block the foreign objects such as dust from contacting the metal wires to protect the metal wires from being corroded, therefore, the scrapping of the product due to the broken metal wires is avoided and thus the cost is decreased.

Preferably, in order to facilitate the implementation, in the array substrate in the invention, the at least one blocking part includes a plurality of the blocking parts, which correspond to the metal wires one to one, and the blocking parts are insulated from each other.

Alternatively, preferably, in order to facilitate the implementation, in the array substrate in the invention, the at least one blocking part includes one blocking part, which is insulated from the metal wires.

Preferably, in order to save cost and increase productivity, the array substrate in the invention further comprises a plurality of pixel electrodes provided above the respective data signal lines, wherein the at least one blocking part is provided in the same layer as the pixel electrodes and is formed of the same material as the pixel electrodes.

Preferably, in order to facilitate the implementation, in the array substrate in the invention, the at least one blocking part is formed of indium tin oxide material. The indium tin oxide material not only has a certain hardness so that it can block the foreign objects from contacting the metal wires, and but also is a common material for manufacturing the array substrate.

Preferably, the array substrate in the invention further comprises a plurality of spare wires provided below the metal wires and electrically connected to the metal wires, respectively. The spare wires have pre-connection functions, that is, once a metal wire cannot transmit electrical signal due to breakage, a corresponding spare wire can transmit the electrical signal instead of the metal wire.

Preferably, in order to facilitate the implementation, the array substrate in the invention further comprises a plurality of gate signal lines provided in the display region, wherein the metal wires are provided in the same layer as the gate signal lines and are formed of the same material as the gate signal lines.

Preferably, in order to save cost and increase productivity, the array substrate in the invention further comprises a common electrode provided below the gate signal lines, wherein the spare wires are provided in the same layer as the common electrode and are formed of the same materials as the common electrode.

Preferably, in order to facilitate the implementation, in the array substrate in the invention, the spare wires are formed of indium tin oxide material. The indium tin oxide material not only can transmit electrical signal but also is a common material for manufacturing the array substrate.

An embodiment of the invention also provides a liquid crystal display panel comprising the array substrate in the invention.

An embodiment of the invention also provides a display device comprising the liquid crystal display panel in the invention.

An embodiment of the invention also provides a manufacturing method of an array substrate, comprising:

forming, on a base substrate, a pattern including a plurality of data signal lines and a pattern including a plurality of connection terminal pads and a plurality of metal wires so that the plurality of data signal lines are provided in a display region of the array substrate, and the plurality of connection terminal pads and the plurality of metal wires are provided in a non-display region of the array substrate, wherein the plurality of metal wires connect the plurality of connection terminal pads with the plurality of data signal lines, respectively; and forming a pattern including at least one blocking part above the metal wires so that the at least one blocking part covers the metal wires.

In the manufacturing method of the array substrate in the invention, as the at least on blocking part covering the metal wires is provided above the metal wires, and can block foreign objects from contacting the metal wires, thus it is possible to prevent the cutting debris from scratching the metal wires in the cutting process, and block the foreign objects such as dust from contacting the metal wires to protect the metal wires from being corroded, therefore, the scrapping of the product due to the broken metal wires is avoided and thus the cost is decreased.

Preferably, in order to facilitate the implementation, in the manufacturing method of the array substrate in the invention, the at least one blocking part includes a plurality of the blocking parts, which correspond to the metal wires one to one, and the blocking parts are insulated from each other.

Alternatively, preferably, in order to facilitate the implementation, in the manufacturing method of the array substrate in the invention, the at least one blocking part includes one blocking part, and wherein before forming the pattern including the at least one blocking part above the metal wires so that the at least one blocking part covers the metal wires, the manufacturing method further comprises:

forming an insulation layer above the plurality of metal wires, wherein the at least one blocking part is insulated from the metal wires through the insulation layer.

Preferably, in order to save cost and increase productivity, in the manufacturing method of the array substrate in the invention, forming the pattern including the at least one blocking part above the metal wires so that the at least one blocking part covers the metal wires comprises:

forming a pixel electrode film above the metal wires; and
forming a pattern including a plurality of pixel electrodes and the at least one blocking part in the pixel electrode film through a single patterning process.

Preferably, in order to prevent the event that the metal wires cannot transmit the electrical signal due to breakage, the manufacturing method of the array substrate in the invention, before forming the plurality of metal wires, further comprises:

forming a pattern including a plurality of spare wires so that the plurality of spare wires are electrically connected to the plurality of metal wires to be formed, respectively.

Preferably, in order to facilitate the implementation, in the manufacturing method of the array substrate in the invention, forming the pattern including the plurality of metal wires comprises:

forming a gate line signal film on the base substrate;
forming a pattern including a plurality of gate signal lines and the plurality of metal wires in the gate signal line film through a single patterning process.

Preferably, in order to save cost and increase productivity, in the manufacturing method of the array substrate in the invention, forming the pattern including the plurality of spare wires comprises:

forming a common electrode film on the base substrate; and forming a pattern including the common electrode and the plurality of spare wires in the common electrode film through a single patterning process.

DETAILED DESCRIPTION OF THE PREFERRED EMBODIMENTS

Hereinafter, detail descriptions of embodiments of an array substrate and a manufacturing method thereof, a liquid crystal display panel and a display device in the invention will be made in conjunction with drawings.

Sizes and shapes of components in the drawings do not reflect the actual proportion of the array substrate, and are just used to exemplify the invention.

Figure 2A:
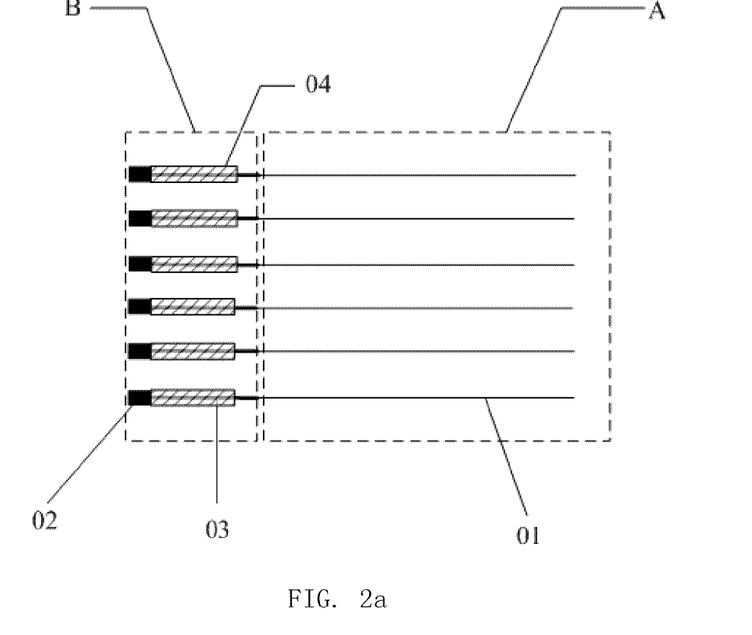
FIG. 2a is a first diagram illustrating arrangements of data signal lines and metal wires of the array substrate in the embodiments of the invention.
Figure 2B:
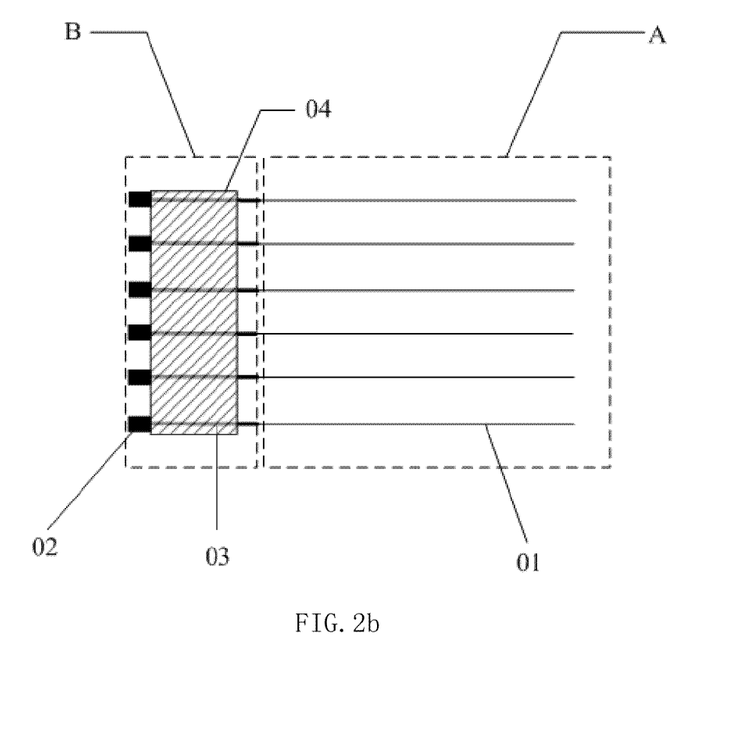
FIG. 2b is a second diagram illustrating arrangements of data signal lines and metal wires of the array substrate in the embodiments of the invention.
Figure 3:
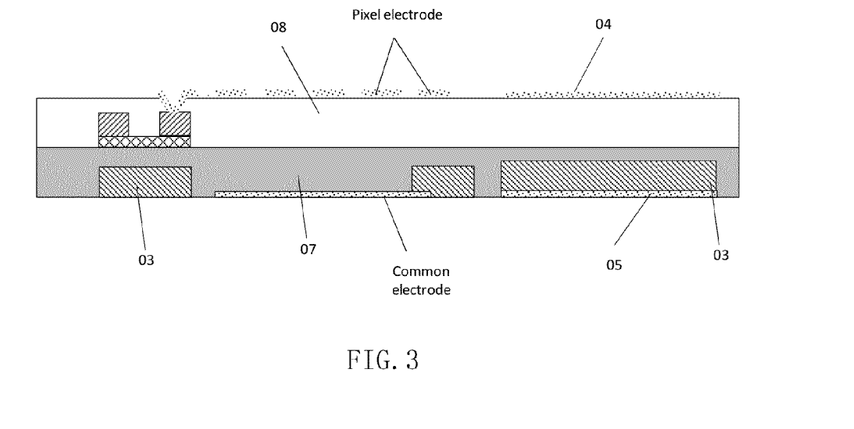
FIG. 3 is a first structural schematic view of an array substrate in the embodiments of the invention.
Figure 4:
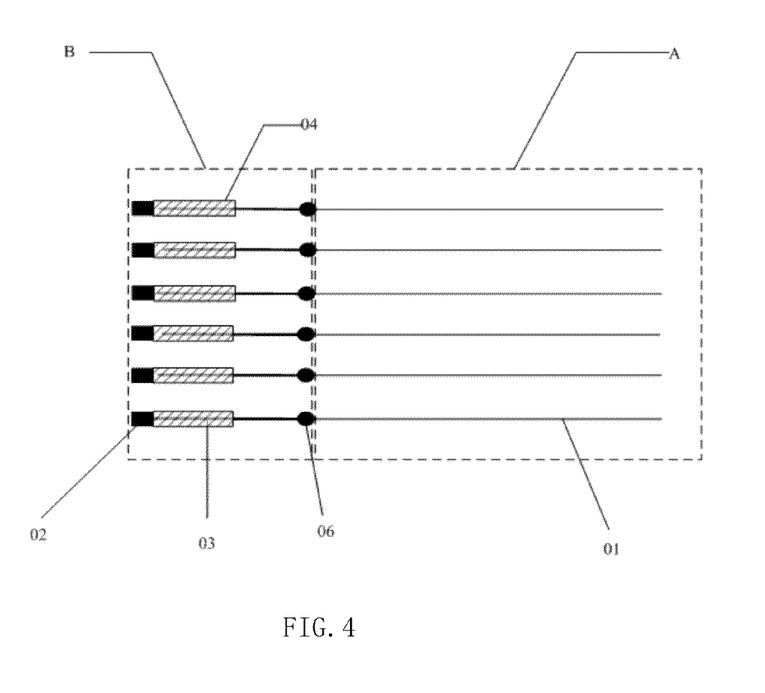
FIG. 4 is a third diagram illustrating arrangements of data signal lines and metal wires of the array substrate in the embodiments of the invention.

An embodiment of the invention provides an array substrate, as shown in FIGS. 2a and 2b, which is divided into a display region A and a non-display region B, wherein the display region A is provided with a plurality of data signal lines 01 therein, and the non-display region B is provided with a plurality of connection terminal pads 02 and a plurality of metal wires 03 connecting the connection terminal pads 02 with the data signal lines 01 respectively;

Each of the plurality of metal wires 03 is provided with one blocking part 04 covering the metal wire thereabove, as shown in FIGS. 3 and 4, and the blocking part can block foreign objects from contacting the metal wire 03.

In the array substrate of the invention, as the blocking part covering the metal wire is provided above the metal wire, which can block foreign objects from contacting the metal wire, comparing to the array substrate in the prior art, it is possible to prevent the cutting debris from scratching the metal wires in the cutting process, and block the foreign objects such as dust from contacting the metal wires to protect the metal wires from being corroded, therefore, the scrapping of the product due to the broken metal wires is avoided and thus the cost is decreased.

Preferably, in the array substrate in the embodiment of the invention, as shown in FIG. 2a, a plurality of the blocking parts 04 are provided, the blocking parts 04 correspond to the metal wires 03 one to one, and the blocking parts 04 are insulated from each other. In an actual implementation, the blocking parts may be provided in the same layer.

Furthermore, in an actual implementation, in the array substrate in the embodiment of the invention, in order to obtain a better blocking effect, the width of the blocking part should be slightly larger than that of the metal wire, of course, the width of the blocking part may also be the same as that of the metal wire, which is not limited herein.

Alternatively, preferably, in the array substrate in the embodiment of the invention, only one blocking part 04 may be provided, as shown in FIG. 2b and the blocking part 04 is insulated from the respective metal wires 03.

Preferably, in the array substrate in the embodiment of the invention, the blocking part may be formed of Indium tin oxide (ITO) material. ITO material not only has a certain hardness so that it may block foreign objects from contacting the metal wire, and but also is common material for manufacturing the array substrate. Of course, the material for forming the blocking part may be any other material which can implement the solution of the invention, which is not limited herein.

Preferably, the array substrate in the embodiment of the invention further comprises a plurality of pixel electrodes provided above the data signal lines, wherein the blocking part(s) may be provided in the same layer as the pixel electrodes and is formed of the same material as the pixel electrodes. Specifically, in the actual implementation, the blocking part(s) may be provided in the same layer as the pixel electrodes and is formed of the same material as the pixel electrodes, thus during manufacturing the array substrate, the blocking part(s) may be provided in the same layer as the pixel electrodes, so that it can be manufactured by just changing the pattern of the corresponding film layer without adding any new manufacturing process, thus the manufacturing process is simplified, the cost is saved and the productivity is increased.

Preferably, as shown in FIG. 3, the array substrate in the embodiment of the invention further comprises a plurality of spare wires 05 provided below and electrically connected to the metal wires 03 respectively. The spare wires have preconnection functions, that is, once a metal wire cannot transmit electrical signal due to breakage, a corresponding spare wire can transmit the electrical signal instead of the metal wire.

Specifically, in the array substrate in the embodiment of the invention, the metal wires may be provided in the same layer as the data signal lines, that is, the metal wires may directly be connected with the data signal lines respectively. For example, taking the process flow of the array substrate of the ADS mode display device as an example, in order to simplify the process flow of manufacturing the array substrate and reduce the manufacturing cost of the array substrate, the manufacturing process flow generally includes: ① forming a common electrode, ② forming gate signal lines, ③ forming a first insulation layer, a semiconductor layer, and a data metal layer on the gate signal lines, and then forming data signal lines and metal wires connecting with the data signal lines through a patterning process, ④ forming a second insulation layer above the data signal lines and the metal wires, and ⑤ forming pixel electrodes above the second insulation layer.

In the above process flow, the data signal lines and the metal wires connecting with the respective data signal lines in the display region can be formed by performing a single photolithographic process on the semiconductor layer and the data metal layer. However, the photolithographic process performing on the first insulation layer, the semiconductor layer and the data metal layer uses a dry etching to perform the etching process, due to the etching orientation of the dry etching, the semiconductor layer below the data metal layer may be remained partly after the dry etching is performed, so that wider metal wires may be obtained, and thus the metal wires occupy larger space, which is adverse to the narrow frame design of the display device.

In the above array substrate in the embodiment of the invention, the metal wires may be provided such that they are formed of the same material and in the same layer as the gate signal lines in the display region, that is, the plurality of metal wires and the plurality of gate signal lines are simultaneously formed from the gate metal layer using a wet etching process, thus the adverse effect due to the etching orientation of the dry etching process can be avoided, which can reduce the widths of the metal wires and gaps between the adjacent metal wires, and facilitate the narrow frame design of the display panel.

Figure 5:
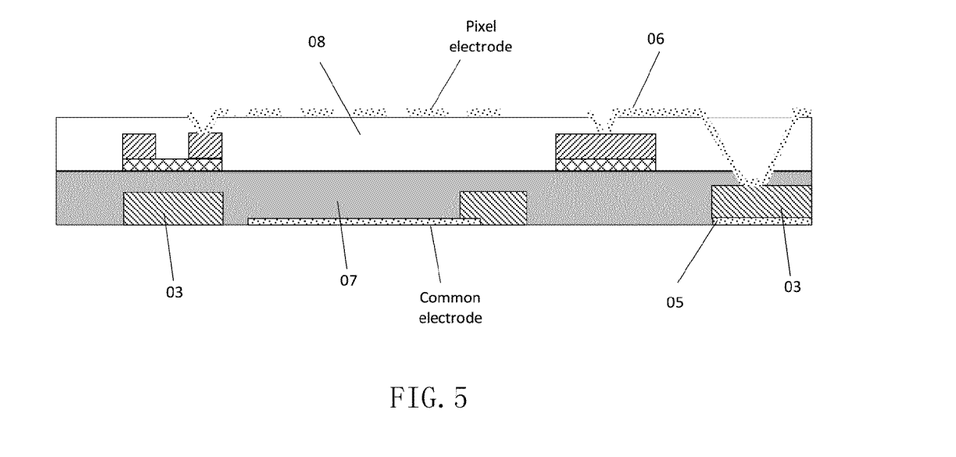
FIG. 5 is a second structural schematic view of an array substrate in the embodiments of the invention.

Furthermore, in the array substrate in the embodiment of the invention, as the gate signal lines and the metal wires are provided in the same layer and formed of the same material, the data signal lines can be connected to the metal wires in various manners, for example, the data signal lines can be directly connected to the metal wires through via holes. Of course, as shown in FIG. 4, the metal wires 03 may be electrically connected to the data signal lines 01 through connection lines 06 respectively. As shown in FIG. 5, a first insulation layer 07 is provided between the metal wires 03 and the data signal lines 01, a second insulation layer 08 is provided between the data signal lines 01 and the connection lines 06, the first insulation layer 07 and the second insulation layer 08 are provided with first via holes 031 corresponding to the metal wires 03 one to one, the second insulation layer 08 is provided with second via holes 011 corresponding to the data signal lines 01 one to one; each connection line 06 is electrically connected to a metal wire 03 through a first via hole 031, and electrically connected to a data signal line 01 through a second via hole 011, so that the metal wires 03 may be connected to the data signal lines 01 respectively. Preferably, in a specific implementation, the connection line may be formed of ITO material.

Preferably, in order to reduce the thickness of the array substrate and simplify the manufacturing process, in the above array substrate in the embodiment of the invention, the connection lines, the blocking parts and the pixel electrodes may be provided in the same layer and formed of the same material.

Preferably, in the above array substrate in the embodiment of the invention, the spare wires may be formed of indium tin oxide (ITO) material. ITO material not only can transmit electrical signal but also is a common material for manufacturing the array substrate. Of course, the spare wires may be formed of any other material so long as it can implement the solution of the invention, which is not limited herein.

Furthermore, in the above array substrate in the embodiment of the invention, the width of the spare wire may be equal to or larger than that of the metal wire. Of course, the width of the spare wire may be smaller than that of the metal wire, which is limited herein. Preferably, the width of the spare wire is the same as that of the metal wire.

Preferably, when the array substrate in the embodiment of the invention is applied to an ADS mode display device, the array substrate may further comprise a common electrode provided below the gate signal lines, wherein the spare wires may be provided in the same layer as the common electrode and be formed of the same material as the common electrode. Specifically, in a specific implementation, the spare wires and the common electrode are provided in the same layer and are formed of the same material. In manufacturing the array substrate, the spare wires may be provided in the same layer as the common electrode, so that it can be manufactured by just changing the pattern of the corresponding film layer without adding any new manufacturing process, thus the manufacturing process is simplified, the cost is saved and the productivity is increased.

Specifically, the array substrate in the embodiment of the invention may be applied to a liquid crystal display (LCD) panel, or applied to an organic light emitting diode (OLED) display panel, which is not limited thereto.

Based on the same concept, embodiments of the invention also provide a liquid crystal display panel comprising the above array substrate in the embodiments of the invention. Other components, which are essential for construction of the liquid crystal display panel, should be appreciated by a person skilled in the art, will not be described herein, and should not be considered to limit the invention. With respect to implementation of the liquid crystal display panel, the embodiments of the above array substrate can be referred to, and repeated description thereof will be omitted.

Based on the same concept, embodiments of the invention also provide a display device comprising the above liquid crystal display panel in the embodiments of the invention, and the display device may be any product or component with display function, such as a mobile phone, a tablet computer, a television, a display, a note computer, a digital image frame, a navigator. With respect to implementation of the display device, the embodiments of the above liquid crystal display panel can be referred to, and repeated description thereof will be omitted.

Based on the same concept, embodiments of the invention also provide a manufacturing method of an array substrate, comprising:

forming, on a base substrate, a pattern of a plurality of data signal lines provided in a display region of the array substrate, and a pattern of a plurality of connection terminal pads and a plurality of metal wires provided in a non-display region of the array substrate, wherein the plurality of metal wires are connected to the connection terminal pads and the data signal lines, respectively; and forming a pattern of at least one blocking part covering the metal wires above the metal wires, the blocking part may block foreign objects from contacting the metal wires.

In the manufacturing method of the array substrate in the invention, as at least on blocking part covering the metal wires is provided above the metal wires, which can block foreign objects from contacting the metal wires, comparing to the array substrate in the prior art, it is possible to prevent the cutting debris from scratching the metal wires in the cutting process, and block the foreign objects such as dust from contacting the metal wires to protect the metal wires from being corroded, therefore, the scrapping of the product due to the broken metal wires is avoided and thus the cost is decreased.

Preferably, in order to facilitate the implementation, in the manufacturing method of the array substrate in the invention, the at least one blocking part includes a plurality of the blocking parts, which correspond to the metal wires one to one, and the blocking parts are insulated from each other.

Furthermore, in the actual implementation, in the array substrate in the embodiment of the invention, in order to obtain a better blocking effect, the width of the blocking part should be slightly larger than that of the metal wire, of course, the width of the blocking part may also be the same as that of the metal wire, which is not limited herein.

Alternatively, preferably, in order to facilitate the implementation, in the manufacturing method of the array substrate in the invention, the at least one blocking part includes one blocking part, and wherein before forming the pattern of at least one blocking part covering the metal wires above the metal wires, the manufacturing method further comprises:

forming an insulation layer above the plurality of metal wires, wherein the blocking part is insulated from the metal wires through the insulation layer.

Preferably, in order to save cost and increase productivity, in the manufacturing method of the array substrate in the invention, forming the pattern of at least one blocking part covering the metal wires above the metal wires comprises:

forming a pixel electrode film above the metal wires; and forming a pattern including a plurality of pixel electrodes and at least one blocking part in the pixel electrode film through a single patterning process. Of course, in a specific implementation, the pattern of the pixel electrodes and the pattern of the blocking part may be manufactured separately, which is not limited herein.

Preferably, in order to prevent the event that the metal wires cannot transmit the electrical signal due to breakage, the manufacturing method of the array substrate in the invention, before forming the plurality of metal wires, may further comprise:

forming a pattern of a plurality of spare wires which are electrically connected to the metal wires to be formed, respectively. Since the spare wires are electrically connected to the metal wires, the spare wires may have pre-connection functions, that is, when a metal wire fails to transmit electrical signal due to breakage, a corresponding spare wire may transmit the electrical signal instead of the metal wire.

Preferably, in order to facilitate the implementation, in the manufacturing method of the array substrate in the invention, forming the pattern of the plurality of metal wires comprises:

forming a gate signal line film on the base substrate;

forming a pattern including a plurality of gate signal lines and the plurality of metal wires in the gate signal line film through a single patterning process.

Of course, in the specific implementation, the pattern of the gate signal lines and the pattern of the metal wires may be manufactured separately, and which is not limited thereto.

Preferably, in order to save cost and increase productivity, in the manufacturing method of the array substrate in the invention, forming the pattern of the plurality of spare wires comprises:

forming a common electrode film on the base substrate; and forming a pattern including the common electrode and the plurality of spare wires in the common electrode film through a single patterning process. Of course, in the specific implementation, the pattern of the common electrode and the pattern of the spare wires may be manufactured separately, which is not limited thereto.

Embodiments of the invention provide an array substrate and a manufacturing method thereof, a liquid crystal display panel and a display device. The array substrate is divided into a display region and a non-display region, wherein a plurality of data signal lines are provided in the display region, and a plurality of connection terminal pads and a plurality of metal wires connecting the connection terminal pads with respective the data signal lines are provided in the non-display region, and wherein at least one blocking part covering the plurality of metal wires is provided above the plurality of metal wires. In the array substrate of the invention, as at least one blocking part covering the metal wires is provided above the metal wires, which can block foreign objects from contacting the metal wires, comparing to the array substrate in the prior art, it is possible to prevent the cutting debris from scratching the metal wires in the cutting process, and block the foreign objects such as dust contacting the metal wires to protect the metal wires from being corroded, therefore, the scrapping of the product due to the broken metal wires is avoided and thus the cost is decreased.

Obviously, various modifications and variations can be made by a person skilled in the art without departing from the spirit and the scope of the present invention. These modifications and variations should be considered to be within protection scope of the present invention, as long as these modifications and variations belong to the scope of the claims of the present invention and their equivalents.

The invention claimed is:

1. An array substrate comprising a display region and a non-display region, wherein a plurality of data signal lines are provided in the display region, and a plurality of connection terminal pads and a plurality of metal wires connecting the connection terminal pads with the respective data signal lines are provided in the non-display region, wherein
    at least one blocking part covering the plurality of metal wires is provided above the plurality of metal wires, and wherein
    the array substrate further comprises a plurality of spare wires provided below the metal wires and electrically connected to the metal wires, respectively, and the spare wires are formed of indium tin oxide material.

2. The array substrate of claim 1, wherein the at least one blocking part includes a plurality of the blocking parts, which correspond to the metal wires one to one, and the blocking parts are insulated from each other.

3. The array substrate of claim 2, further comprising a plurality of spare wires provided below the metal wires and electrically connected to the metal wires, respectively.

4. The array substrate of claim 1, wherein the at least one blocking part includes one blocking part, which is insulated from the metal wires.

5. The array substrate of claim 4, further comprising a plurality of spare wires provided below the metal wires and electrically connected to the metal wires, respectively.

6. The array substrate of claim 1, further comprising a plurality of pixel electrodes provided above the respective data signal lines, wherein the at least one blocking part is provided in the same layer as the pixel electrodes and is formed of the same material as the pixel electrodes.

7. The array substrate of claim 6, further comprising a plurality of spare wires provided below the metal wires and electrically connected to the metal wires, respectively.

8. The array substrate of claim 1, wherein the at least one blocking part is formed of indium tin oxide material.

9. The array substrate of claim 1, further comprising a plurality of gate signal lines provided in the display region, wherein the metal wires are provided in the same layer as the gate signal lines and are formed of the same material as the gate signal lines.

10. The array substrate of claim 9, further comprising a common electrode provided below the gate signal lines, wherein the spare wires are provided in the same layer as the common electrode and are formed of the same materials as the common electrode.

11. A liquid crystal display panel comprising the array substrate of claim 1.

12. A manufacturing method of an array substrate, comprising:
    forming, on a base substrate, a pattern including a plurality of data signal lines and a pattern including a plurality of connection terminal pads and a plurality of metal wires so that the plurality of data signal lines are provided in a display region of the array substrate, and the plurality of connection terminal pads and the plurality of metal wires are provided in a non-display region of the array substrate, wherein the plurality of metal wires connect the plurality of connection terminal pads with the plurality of data signal lines, respectively; and
    forming a pattern including at least one blocking part above the metal wires so that the at least one blocking part covers the metal wires, wherein
    before forming the plurality of metal wires, the manufacturing method of an array substrate further comprises:
    forming a pattern including a plurality of spare wires so that the plurality of spare wires are electrically connected to the plurality of metal wires to be formed respectively; and wherein
    forming the pattern including the plurality of spare wires further comprises:
    forming a common electrode film on the base substrate; and
    forming a pattern including the common electrode and the plurality of spare wires in the common electrode film through a single patterning process.

13. The manufacturing method of claim 12, wherein the at least one blocking part includes a plurality of the blocking parts, which correspond to the metal wires one to one, and the blocking parts are insulated from each other.

14. The manufacturing method of claim 12, wherein the at least one blocking part includes one blocking part, and
    wherein before forming the pattern including the at least one blocking part above the metal wires so that the at least one blocking part covers the metal wires, the manufacturing method further comprising:
    forming an insulation layer above the plurality of metal wires, wherein the at least one blocking part is insulated from the metal wires through the insulation layer.

15. The manufacturing method of claim 12, wherein forming the pattern including the at least one blocking part above the metal wires so that the at least one blocking part covers the metal wires comprises:
    forming a pixel electrode film above the plurality of metal wires;
    forming a pattern including a plurality of pixel electrodes and the at least one blocking part in the pixel electrode film through a single patterning process.

16. The manufacturing method of claim 12, wherein forming the pattern including the plurality of metal wires comprises:
    forming a gate signal line film on the base substrate; and
    forming a pattern including a plurality of gate signal lines and the plurality of metal wires in the gate signal line film through a single patterning process.

\* \* \* \* \*